US011437230B2

(12) United States Patent
Wu et al.

(10) Patent No.: US 11,437,230 B2
(45) Date of Patent: Sep. 6, 2022

(54) AMORPHOUS CARBON MULTILAYER COATING WITH DIRECTIONAL PROTECTION

(71) Applicant: APPLIED MATERIALS, INC., Santa Clara, CA (US)

(72) Inventors: Wei Wu, San Carlos, CA (US); Feng Zhang, Campbell, CA (US); Xiawan Yang, San Jose, CA (US); Jinhan Choi, Fremont, CA (US); Anisul Haque Khan, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 244 days.

(21) Appl. No.: 16/841,010

(22) Filed: Apr. 6, 2020

(65) Prior Publication Data
US 2021/0313166 A1    Oct. 7, 2021

(51) Int. Cl.
*H01L 21/02* (2006.01)
*C23C 16/26* (2006.01)
*C23C 16/455* (2006.01)
*C23C 16/50* (2006.01)

(52) U.S. Cl.
CPC .......... *H01L 21/0212* (2013.01); *C23C 16/26* (2013.01); *C23C 16/45525* (2013.01); *C23C 16/50* (2013.01); *H01L 21/022* (2013.01); *H01L 21/0228* (2013.01); *H01L 21/02274* (2013.01)

(58) Field of Classification Search
None
See application file for complete search history.

(56) References Cited

U.S. PATENT DOCUMENTS

| | | | |
|---|---|---|---|
| 7,365,005 B1 | 4/2008 | Gadgil | |
| 7,407,893 B2 | 8/2008 | Seamons et al. | |
| 7,846,846 B2 | 12/2010 | Bera et al. | |
| 8,728,955 B2 | 5/2014 | LaVoie et al. | |
| 9,362,133 B2 | 6/2016 | Shamma et al. | |
| 9,378,971 B1 | 6/2016 | Briggs et al. | |
| 9,673,058 B1 | 6/2017 | Briggs et al. | |

(Continued)

FOREIGN PATENT DOCUMENTS

| WO | 2014165397 A1 | 10/2014 |
|---|---|---|
| WO | 2021003224 A1 | 1/2021 |

*Primary Examiner* — Asok K Sarkar
(74) *Attorney, Agent, or Firm* — Lowenstein Sandler LLP

(57) ABSTRACT

Disclosed herein is a high throughput method for providing directional protection to a three dimensional feature on a substrate by forming a multi-layer amorphous carbon-containing coating with tunable conformality thereon. Forming the multi-layer amorphous carbon-containing coating with tunable conformality includes depositing a base layer onto a horizontal surface of the three dimensional features, and a second layer over the base layer and onto a first portion of a vertical or inclined surface of the three dimensional feature. The base layer includes a first material with a first sticking coefficient and the second layer includes a second material with a second sticking coefficient that is smaller than the first sticking coefficient. The first material includes no fluorine or less fluorine than the second material. Also disclosed herein is a method of manufacturing a three dimensional device as well as three dimensional devices.

20 Claims, 4 Drawing Sheets

(56) References Cited

U.S. PATENT DOCUMENTS

| | | | |
|---|---|---|---|
| 2010/0062612 A1* | 3/2010 | Ishikawa | H01L 21/3146 |
| | | | 257/E21.489 |
| 2010/0093187 A1* | 4/2010 | Lee | C23C 16/26 |
| | | | 257/E21.259 |
| 2014/0094035 A1* | 4/2014 | Ji | C23C 16/045 |
| | | | 204/298.38 |
| 2014/0120727 A1 | 5/2014 | Subramanian et al. | |
| 2018/0061628 A1* | 3/2018 | Ou | H01L 21/32 |
| 2018/0151333 A1 | 5/2018 | Katsunmuma | |
| 2018/0301347 A1 | 10/2018 | Kihara et al. | |
| 2019/0172714 A1* | 6/2019 | Bobek | H01L 21/0337 |
| 2019/0198338 A1 | 6/2019 | Kim et al. | |
| 2019/0385845 A1* | 12/2019 | Manna | H01L 21/02115 |
| 2020/0035505 A1 | 1/2020 | Jiang et al. | |
| 2020/0083345 A1* | 3/2020 | Canaperi | H01L 21/0234 |
| 2020/0105509 A1 | 4/2020 | Drewery et al. | |
| 2021/0134564 A1 | 5/2021 | Sawachi et al. | |
| 2021/0151348 A1* | 5/2021 | Utsuno | C23C 16/50 |

* cited by examiner

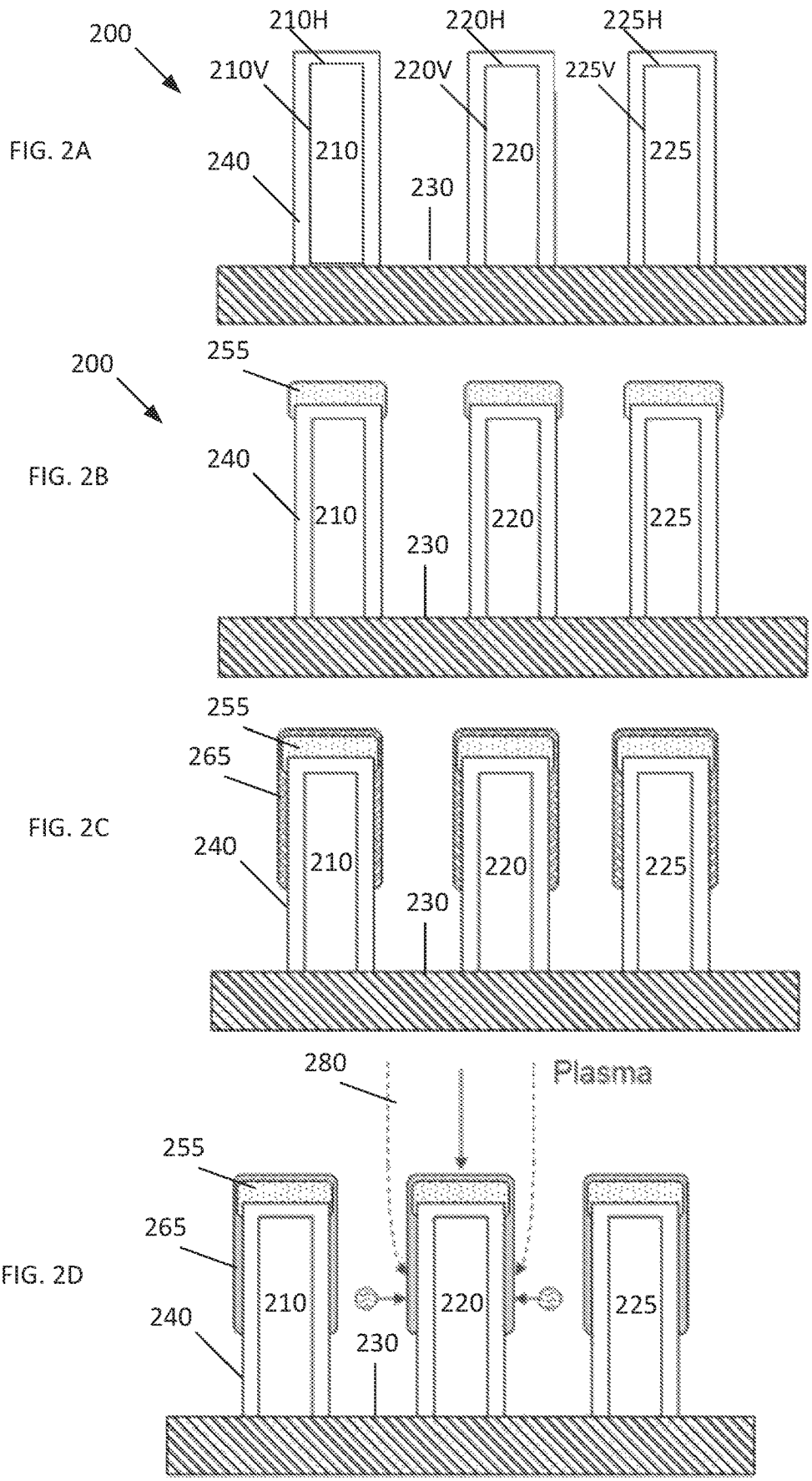

300

Deposit, via atomic layer deposition, a conformal barrier coating layer directly onto the three dimensional feature 310

Form a multi-layer amorphous carbon-containing coating with tunable conformality on the three dimensional feature 320

Deposit a base layer onto a horizontal surface of the three dimensional feature 330

Deposit a second layer over the base layer and onto a first portion of a vertical or inclined surface of the three dimensional feature 340

Deposit a third layer over the second layer and onto a second portion of the vertical or inclined surface of the three dimensional feature, the second portion reaching deeper along the vertical or inclined surface of the three dimensional feature than the first portion 350

Repeat deposition of at least one additional layer, wherein each additional layer is deposited over a preceding layer and onto a portion of the vertical or inclined surface of the three dimensional feature that reaches deeper along the vertical surface of the three dimensional feature than a preceding portion covered by the preceding layer 360

Form a multi-layer amorphous carbon-containing coating with tunable conformality on the three dimensional feature 410

Etch the substrate and the multi-layer amorphous carbon-containing coating without etching the underlying one or more three dimensional features on the substrate 420

AMORPHOUS CARBON MULTILAYER COATING WITH DIRECTIONAL PROTECTION

TECHNICAL FIELD

Embodiments of the present disclosure relate, in general, to a method of coating patterned substrates with tunable conformality and directional protection. Embodiments described herein relate to high aspect ratio structures with horizontal, vertical, and inclined patterns.

BACKGROUND

In the semiconductor industry, devices are fabricated by a number of manufacturing processes producing structures of an ever-decreasing size. The industry is trending towards increased manufacturing of three dimensional structures in which layers are stacked vertically to generate denser devices with smaller areas. As device geometries shrink, controlling the process uniformity and repeatability become much more challenging. This is particularly challenging with modern three dimensional structures that include high aspect ratio structures with horizontal, vertical, and inclined patterns.

Existing manufacturing processes provide low directional protection to high aspect ratios features on substrates. Directional protection is useful for three dimensional devices which are to be etched along certain directions while keeping other features intact along other directions. Although directional etch can be achieved by manipulating plasma conditions and etchant selectivity, some isotropic etching will inevitably occur. It would be advantageous to provide a high throughput method for depositing a protective coating that provides reliable directional protection to three dimensional features during various manufacturing processes, such as etch processes.

BRIEF SUMMARY OF EMBODIMENTS

In certain embodiments, the instant disclosure is directed to a method for providing directional protection to a three dimensional feature on a substrate. The method comprising includes forming a multi-layer amorphous carbon-containing coating with tunable conformality on the three dimensional feature. Forming the multi-layer amorphous carbon-containing coating includes depositing a base layer onto a horizontal surface of the three dimensional feature, wherein the base layer includes a first material having a first sticking coefficient. Forming the multi-layer amorphous carbon-containing coating further includes depositing a second layer over the base layer and onto a first portion of a vertical or inclined surface of the three dimensional feature, wherein the second layer includes a second material having a second sticking coefficient that is smaller than the first sticking coefficient. The first material includes no fluorine or less fluorine than the second material.

In certain embodiments, the instant disclosure is directed to a three dimensional device. The three dimensional device includes a substrate having a three dimensional feature thereon, wherein the three dimensional feature has a horizontal surface and a vertical or inclined surface. The three-dimensional device further includes a multi-layer amorphous carbon-containing coating with tunable conformality coated over the three dimensional feature. The multi-layer coating includes a base layer coated onto the horizontal surface of the three dimensional feature, wherein the base layer includes a first material having a first sticking coefficient. The multi-layer coating further includes a second layer coated over the base layer and over a first portion of the vertical or inclined surface of the three dimensional feature, wherein the second layer includes a second material having a second sticking coefficient that is smaller than the first sticking coefficient. The first material includes no fluorine or less fluorine than the second material.

In certain embodiments, the instant disclosure is directed to a method for forming a three dimensional device. The method includes forming a multi-layer amorphous carbon-containing coating with tunable conformality on one or more three dimensional features on a substrate. Forming the multi-layer amorphous carbon-containing coating includes depositing a base layer onto a horizontal surface of the three dimensional feature, wherein the base layer includes a first material having a first sticking coefficient. Forming the multi-layer amorphous carbon-containing coating further includes depositing a second layer over the base layer and onto a first portion of a vertical or inclined surface of the three dimensional feature, wherein the second layer includes a second material having a second sticking coefficient that is smaller than the first sticking coefficient. The first material comprises no fluorine or less fluorine than the second material. The method for forming the three dimensional device further includes etching the substrate and the multi-layer amorphous carbon-containing coating without etching the underlying one or more three dimensional features on the substrate.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 2A-2D depict cross-sectional schematic views of an embodiment of a multi-layer amorphous carbon-containing coating deposition and etching sequence.

FIG. 3 depicts a flow chart of a method for depositing a multi-layer amorphous carbon-containing coating according to an embodiment.

DETAILED DESCRIPTION OF EMBODIMENTS

Figure 1A:
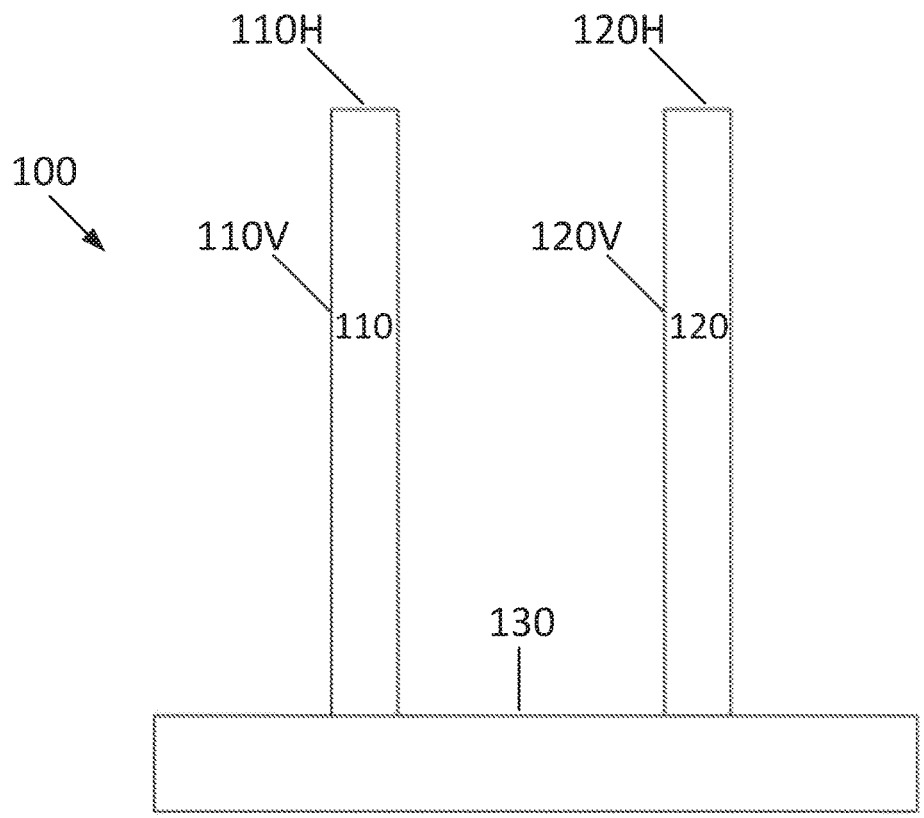
FIGS. 1A-1B depict cross-sectional schematic views of an embodiment of a multi-layer amorphous carbon-containing coating.

In the semiconductor industry, devices are fabricated by a number of manufacturing processes producing structures of an ever-decreasing size with three dimensional vertical and inclined features that have high aspect ratios. The cost per bit for semiconductor devices has been dramatically reduced by the advent of three dimensional semiconductor devices, and has been further reduced by increased numbers of stacking layers in the three dimensional devices. However, high volume production is not presently achieved in industry for three dimensional devices with a high number of stacking layers.

Processes that are performed in the manufacture of three dimensional devices (e.g., three dimensional memory devices) include plasma etch and plasma clean processes, both of which expose a substrate to a high-speed stream of plasma to etch or clean a surface of the substrate. Such three dimensional devices include vertical and inclined features with high aspect ratios that are vulnerable to plasma attack during such plasma etch and plasma clean processes. Three dimensional vertical and inclined features that have high aspect ratios become particularly vulnerable to plasma attacks, such as in dry etch processes, due to the lack a protective layer with directional protection that is traditionally deposited on three dimensional features.

Existing protective layers utilize a single layer fluorinated hydrocarbon overlaying predominantly top horizontal surfaces of the three dimensional features and do not overlay vertical or inclined surfaces. Existing single layer fluorinated hydrocarbon coatings provide robust protection to the top horizontal surface of three dimensional structures, which are under the greatest attack from plasma etchants by overlaying the top horizontal surfaces with a robust layer. However, the single layer fluorinated hydrocarbon coatings on the top horizontal surface does not diffuse to the side walls of surface features and does not provide protection to the vertical and/or inclined surfaces of the three dimensional features. Hence, plasma etchant may attack vertical and/or inclined surface of the three dimensional features having horizontal surfaces that are protected.

In another example, existing protective layers utilize conformal atomic layer deposition overlaying the entire three dimensional feature with a thin coating that has a uniform thickness throughout. However, top horizontal surfaces of the three dimensional features are subjected to a greater attack by plasma etchants. Accordingly, surface features that are protected by such uniform coatings provide insufficient protection to the top horizontal surfaces of features and/or provide protection to surfaces that should not be protected.

Existing protective layers for three dimensional features provide insufficient directional protection of three dimensional surfaces. Embodiments described herein provide improved protective coatings on three dimensional surfaces (and in particular on three dimensional surfaces with high aspect ratio features) that provide protection from directional diffusion of fluorinated hydrocarbons and protection from different etching mechanism at horizontal and vertical directions.

The instant disclosure provides directional protection for high aspect ratio structures of three dimensional devices in various manufacturing processes, such as reactive-ion etching processes. Each surface geometry (e.g., horizontal, vertical, and inclined surfaces) is subjected to a different nature of directional etching in processes such as reactive-ion etching and would benefit from a corresponding compatible surface protection. The instant disclosure provides a method for forming a protective coating with different components along different directions or portions of the three dimensional features to resist different natures of directional etching. Different materials and/or thicknesses are selected to provide an optimal balance between coating robustness and coating conformality, depending on the depth of the three dimensional feature to be coated and its vulnerability to plasma etchant attacks. The method described herein is a high throughput method that also improves yield of three dimensional devices (e.g., three dimensional memory devices). The instant disclosure also provides a protective coating with different components along different portions of three dimensional features.

In certain embodiments, the instant disclosure is directed to a high throughput method for forming a multi-layer amorphous carbon-containing coating on a patterned substrate with tunable conformality and directional protection selectivity by using a radio frequency (RF) back-to-back plasma enhanced chemical vapor deposition technique. This method is applicable to high aspect ratio structures having aspect ratios (defined as depth (D):width (W)) of about 10:1 to about 500:1, or about 10:1 to about 300:1 in three dimensional devices (such as three dimensional integrated circuits) with horizontal, vertical, and inclined patterns.

The multi-layer amorphous carbon-containing coating may be deposited in an etch chamber with an enabled RF back-to-back plasma enhanced chemical vapor deposition technique for high throughput. The phrase "RF back-to-back," as used herein, indicates that during deposition, the plasma is not turned off between deposition cycles, and the deposition occurs continuously. This technique saves time and improves yield of three dimensional devices as compared to traditional techniques for applying protective coatings on three dimensional devices. In comparison, traditional plasma enhanced chemical vapor deposition methods of applying protective coatings stop the plasma and stabilize the chamber between each layer deposition, which is extremely time consuming and hinders the yield of three dimensional devices.

In certain embodiments, the deposition method described herein includes depositing a base layer made of a first material onto a horizontal surface of the three dimensional feature. The deposition method further includes depositing a second layer made of a second material over the base layer and onto a first portion of a vertical or inclined surface of the three dimensional feature. The deposition method may optionally further include repeatedly depositing at least one additional layer made of an additional material over a preceding layer made of a preceding material and onto a portion of the vertical or inclined surface of the three dimensional feature that extends deeper on the vertical or inclined surface than the preceding layer. The number of layers in the multi-layer coating may range from 2 to 10 in embodiments. In other embodiments, a greater number of layers may be used.

Each layer is made of a corresponding material that has a corresponding sticking coefficient. The sticking coefficient of the base layer is the greatest among the various layers, and the sticking coefficient gradually decreases with each subsequent layer. Materials having smaller sticking coefficients can attain a deeper vertical or inclined surface coverage (e.g., can coat portions of the vertical or inclined surface that are nearer a bottom of a surface feature). The phrase "deeper vertical or inclined surface coverage," as used herein, may refer to a higher aspect ratio of the vertical or inclined surface of the three dimensional feature that is covered to the horizontal surface of the three dimensional feature. The base layer in the multi-layer coating described herein has the lowest fluorine concentration (or no fluorine), and the fluorine concentration gradually increases with each subsequent layer in an embodiment.

In certain embodiments, the instant disclosure is directed to a method for manufacturing a three dimensional device, which method includes depositing the multi-layer amorphous carbon-containing coating on a patterned substrate as described herein and etching the substrate and the coating thereon. In this manufacturing method, the substrate and the coating are etched in a manner that protects the integrity of the horizontal, vertical, and inclined surfaces of the underlying three dimensional feature on the substrate from directional etching.

FIG. 1A depicts an exemplary substrate 100 having a high aspect ratio pattern depicted by two pillars 110 and 120 and a bottom surface 130. Each of the two pillars 110 and 120 has a horizontal surface 110H and 120H, respectively, and a vertical surface 110V and 120V, respectively. Although the high aspect ratio features depicted in FIG. 1A have only a horizontal and a vertical surface, it should be appreciated that this disclosure also encompasses patterns that have inclined surfaces.

Three dimensional features described herein may have a high aspect ratio, defined as the ratio of the three dimensional feature's depth (D) to the three dimensional feature's width (W) (D:W). High aspect ratios (D:W) may range from any of about 10:1, about 20:1, about 30:1, about 40:1, about 50:1, about 60:1, about 70:1, about 80:1, about 90:1, about 100:1, about 120:1, about 140:1 about 160:1, about 180:1, about 200:1, about 220:1, about 240:1 to any of about 260:1, about 280:1, about 300:1, about 320:1, about 340:1 about 360:1, about 380:1, about 400:1, about 420:1, about 440:1, about 460:1, about 480:1, or about 500:1, or any sub-range or single value therein.

In certain embodiments, substrate 100 may be subjected to a reactive-ion etching process to etch bottom surface 130. To avoid damaging horizontal surfaces (110H and 120H) and vertical surfaces (110V and 120V) of pillars 110 and 120, these surfaces may be covered with a thin outside liner 140 made of, for example, poly silicon or silicon oxide materials. In certain embodiments, the thin outside liner 140 may be made of silicon nitride. The material of the thin outside liner 140 may be selected based on its compatibility with subsequent process flow. The thin outside liner 140 may be deposited by atomic layer deposition to generate a conformal, thin, film of uniform thickness throughout the entire surface of the three dimensional feature.

The ALD process allows for conformal and continuous film layers having uniform film thickness on surface of three dimensional structures having complex geometric shapes and large aspect ratios. Sufficient exposure time of precursor used during the ALD process to the surface enable the precursors to disperse and fully react with the surface in its entirety, including all of its three-dimensional complex features. ALD deposited layers have a very low porosity of less than 1% in embodiments, less than 0.1% in some embodiments, or approximately 0% in further embodiments. Additionally, ALD deposited layers have a conformal coverage of the underlying surface that is coated with a uniform thickness having a thickness variation of less than about +/−20%, a thickness variation of less than about +/−10%, a thickness variation of less than about +/−5%, or a lower thickness variation between various portions of the covered surface.

The conformality of layers deposited by ALD may also be tuned in certain embodiments. For instance, by tuning the amount of precursor and the process time, the precursor density may be larger at the top (i.e., along a shallower depth) and small (down to zero) at the bottom (i.e., along a deeper depth). Such tuning would generate an ALD layer that is thicker at the top of the high aspect ratio feature and thinner (or non-existent) at the bottom of the high aspect ratio feature. While the thickness of ALD layers may be tuned, the thickness different that may be achieved by ALD (between the top of the high aspect ratio feature and the bottom) may not be large enough to achieve the directional protection that can be attained with the instant disclosure.

Thin outside liner 140 by itself may be insufficient to provide adequate directional protection to the various surfaces of the three dimensional feature. This is so because during processes such as reactive-ion etching, top horizontal surfaces 110H and 120H and vertical or inclined surfaces that are closer to the top horizontal surfaces (i.e., vertical or inclined surfaces along a smaller D:W aspect ratio of the 3D features) are more vulnerable to plasma etchants than vertical or inclined surfaces that are closer to the bottom surface 130 of the substrate (i.e., vertical or inclined surfaces along larger D:W aspect ratio of the 3D feature). Hence, rather than coating the 3D feature with a coating that has a uniform thickness throughout, it would be beneficial to coat the 3D feature with a coating that has variable coating thickness at different surface regions. In this manner, surfaces on the 3D feature that are more vulnerable to plasma etchants (smaller D:W aspect ratio and horizontal surfaces) may have a thicker protective coating and surfaces on the 3D feature that are less vulnerable to plasma etchants (larger D:W aspect ratio) may have a thinner protective coating. An example of such coating is described in more detail with respect to FIG. 1B.

Figure 1B:
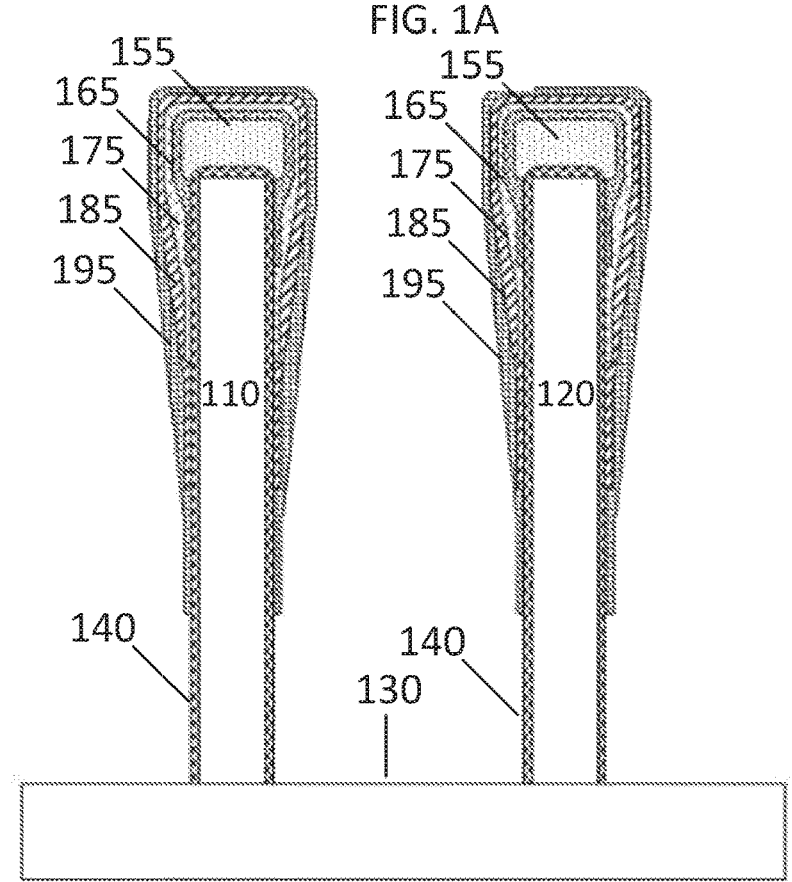

FIG. 1B is a cross-sectional schematic view of an embodiment of a multi-layer amorphous carbon-containing coating on pillars 110 and 120. The multi-layer amorphous carbon containing coating depicted in FIG. 1B includes five layers in addition to the ALD deposited thin outside liner underlying the coating. While the exemplary embodiment depicted in FIG. 1B includes five layers, coatings described herein may include any number of layers ranging from any of 2, 3, 4, 5, or 6 to any of 7, 8, 9, or 10 layers, or any single number of layers therein, or any subrange of layers therein. Additionally, more than 10 layers may be used in embodiments. In one embodiment, the coating has two layers. In one embodiment, the coating has three layers. In one embodiment, the coating has four layers. In one embodiment, the coating has five layers. In one embodiment the coating has six layers. In one embodiment, the coating has seven layers. In one embodiment, the coating has eight layers. In one embodiment, the coating has nine layers. In one embodiment, the coating has ten layers. In certain embodiments, the coating has anywhere from 2 to 10 layers.

In certain embodiments, the first layer in the multi-layer amorphous carbon-containing coating is a base layer 155 that includes a first material. The base layer 155 coats the top horizontal surface of the three dimensional feature (surface 110H and 120H in FIG. 1B).

The first material used to form the base layer 155 of the coating has a first sticking coefficient, which will be the highest sticking coefficient as compared to subsequent materials used to form subsequent layers in the coating. The term "sticking coefficient," as used herein, refers to the number of adsorbate atoms (or molecules) that adsorb, or "stick," to a surface to the total number of atoms (or molecules) that impinge upon that surface during the same time period. The value of the sticking coefficient may range from 0, when no atoms (or molecules) stick, to 1, when all impinging atoms (or molecules) stick. Typically, the sticking coefficient decreases with increasing fluorine concentration in a fluorinated hydrocarbon compound having the formula $CH_xF_y$, where x ranges from 0 to 4 and y ranges from 0 to 8.

The base layer is also the thickest layer as compared to subsequent layers in the coating in embodiments. The greater thickness of the base layer provides the horizontal surface of the three dimensional feature greater protection from plasma etchants being that the top horizontal surfaces of the three dimensional features are subjected to the greatest plasma etchant attach and are the most vulnerable thereto. The thickness of the base layer may range from any of about 5 nm, about 10 nm, about 20 nm, about 30 nm, about 40 nm, about 50 nm, about 75 nm, or about 100 nm to any of about 125 nm, about 150 nm, about 175 nm, about 200 nm, about 250 nm, about 300 nm, about 350 nm, about 400 nm, or about 500 nm.

Additionally, the first material used to form the base layer 155 of the coating has the lowest amount of fluorine as compared to subsequent materials used to form subsequent layers in embodiments. In certain embodiments, the first material of the base layer 155 has no fluorine therein. A non-limiting list of suitable materials that may form the first material of the base layer includes one or more of $SiCl_3$, $CH_4$, $CH_3F$, $CH_2F_2$, $C_4F_6$, and $C_4F_8$.

The base-layer material is selected to be compatible with the underlying thin outside liner 140 while also being resistant to plasma etchant as will be described with reference to FIGS. 2A-2D. For better protection, the base-layer material (e.g., hydrocarbon or fluorinated hydrocarbon) generally contains none or less fluorine (as compared to subsequent layers) to prevent or minimize free fluorine from releasing from the base layer and eroding the underlying outside liner 140. The base-layer 255 is deposited predominantly to resist vertically accelerated ion etchant. The none or less fluorine in the base layer material (e.g., amorphous hydrocarbon or fluorinated hydrocarbon) generally has a high sticking coefficient which limits the base material's deposition depth on vertical or inclined surfaces.

In order to protect the sidewall of the three dimensional feature, which is attacked by tilted ions and radicals, a second or more layers (e.g., 165-195) is deposited on top of base-layer 155. The second and/or subsequent layers generally have gradually increasing amounts of fluorine and gradually decreasing sticking coefficients, so that fluorinated hydrocarbons can attaches deeper to the vertical or inclined surface of the three dimensional features.

In certain embodiments, a second layer 165 is coated over the base layer 155 and over a first portion of the vertical or inclined surface of the three dimensional feature (such as a first portion of vertical surfaces 110V and 120V in FIG. 1B). The second layer 165 includes a second material having a second sticking coefficient that will be smaller than the first sticking coefficient of the first material forming the base layer 155. The smaller sticking coefficient of the second material (compared to the first sticking coefficient of the first material) enables the second material to overcoat the horizontal surface of the base layer 155 and a first portion of the vertical or inclined surface of the three dimensional feature.

Materials having smaller sticking coefficients can attain a deeper vertical or inclined surface coverage. In certain embodiments, the second material has a second sticking coefficient that enables it to coat vertical or inclined surfaces of the three dimensional feature up to a depth characterized by an aspect ratio (D:W) of up to about 10:1, up to about 8:1, up to about 5:1, or up to about 3:1.

The thickness of the second layer may range from any of about 0.5 nm, about 1 nm, about 2 nm, about 3 nm, about 4 nm, about 5 nm, about 6 nm, or about 7 nm to any of about 8 nm, about 9 nm, about 10 nm, about 12 nm, about 15 nm, about 20 nm, about 25 nm, or about 30 nm.

The second layer provides directional plasma etchant protection to a portion of the vertical or inclined surface of the three dimensional feature. The thickness of the second layer and any subsequent layers that coat vertical or inclined surfaces of the three dimensional features may be selected based on several considerations that include, among others, the space between the three dimensional features and the vulnerability of that vertical or inclined surface to directional plasma etchant attack based on its depth. For instance, shallower vertical or inclined surfaces (i.e., those that have a lower aspect ratio and are closer to the top horizontal surface of the three dimensional feature) are more vulnerable to plasma etchant attack as compared to deeper vertical or inclined surfaces (i.e., those that have a higher aspect ratio and are closer to the bottom surface 130 of the substrate). As such, shallower vertical or inclined surfaces would benefit from a thicker coating while deeper vertical or inclined surfaces may be adequately protected with a thinner coating.

At the same time, the thickness of the coating of shallower vertical or inclined surfaces preferentially does not clog the space between the three dimensional features to maintain a clear path for the plasma etchant to etch the bottom surface 130 of the substrate. For instance, if the distance between two three dimensional features (e.g., pillars 110 and 120) is 50 nm, the thickness of the second layer on the vertical surface is 5 nm, and there is at least two additional layers over the second layer (e.g., a third layer and a fourth layer), each with a thickness of 5 nm, the vertical portion of the multi-layer coating of the two three dimensional features could merge and clog the space between the two three dimensional features. Such phenomenon may be prevented by adjusting the number of layers in the multi-layer coating and the thickness of the various layers in accordance with the spacing between the three dimensional features on the substrate. In certain embodiments, the second layer, third layer, or subsequent layers are less prone to clog the space between two three dimensional features since more radicals diffuse to deeper regions of the three dimensional features due to the smaller sticking coefficient of the gas used for forming these subsequent layers.

In embodiments, the second material used to form the second layer 165 of the coating has a greater amount of fluorine as compared to the amount of fluorine in the base layer 155, but less fluorine as compared to subsequent materials used to form subsequent layers. A non-limiting list of suitable materials that may form the second material of the second layer 165 includes one or more of $CH_4$, $CH_3F$, $CH_2F_2$, $C_4F_6$, and $C_4F_8$.

In certain embodiments, the multi-layer amorphous carbon-containing coating further includes at least one additional layer, such as a third layer 175, a fourth layer 185, a fifth layer 195, and so on up to 10 layers. Each additional layer coats a preceding layer and a portion of the vertical or inclined surface of the three dimensional feature that reaches deeper along the vertical or inclined surface of the three dimensional feature covered by the preceding layer. For instance, a third layer 175, if present, covers a portion of the vertical or inclined surface of the three dimensional feature that reaches deeper along the vertical or inclined surface of the three dimensional feature covered by the second layer 165; a fourth layer 185, if present, covers a portion of the vertical or inclined surface of the three dimensional feature that reaches deeper along the vertical or inclined surface of the three dimensional feature covered by the third layer 175; a fifth layer 195, if present, covers a portion of the vertical or inclined surface of the three dimensional feature that reaches deeper along the vertical or inclined surface of the three dimensional feature covered by the fourth layer 185; and this pattern may continue for subsequent layers.

As indicated previously, materials having smaller sticking coefficients can attain a deeper vertical or inclined surface coverage and provide for a coating that is more conformal. Hence, each additional layer is made of a material having an additional sticking coefficient that is smaller than a sticking coefficient of the preceding layer to enable each additional layer to provide deeper coverage of the vertical or inclined surface of the three dimensional feature. For instance, a third layer 175, if present, is made of a third material having a third sticking coefficient that is smaller than the second sticking coefficient of the second material forming second layer 165; a fourth layer 185, if present, is made of a fourth material having a fourth sticking coefficient that is smaller than the third sticking coefficient of the third material forming third layer 175; a fifth layer 195, if present, is made of a fifth material having a fifth sticking coefficient that is smaller than the fourth sticking coefficient of the fourth material forming second layer 185; and this pattern may continue for subsequent layers.

In embodiments where a third layer is present in the multi-layer coating, the third material that forms the third layer has a third sticking coefficient that enables it to coat vertical or inclined surfaces of the three dimensional feature up to a depth characterized by an aspect ratio (D:W) ranging from about 10:1 to about 50:1, from about 15:1 to about 40:1, or from about 20:1 to about 30:1, or any sub-range of aspect ratios or single aspect ratio value therein.

In embodiments where a fourth layer is present in the multi-layer coating, the fourth material that forms the fourth layer has a fourth sticking coefficient that enables it to coat vertical or inclined surfaces of the three dimensional feature up to a depth characterized by an aspect ratio (D:W) ranging from about 50:1 to about 100:1, from about 60:1 to about 90:1, or from about 70:1 to about 80:1, or any sub-range of aspect ratios or single aspect ratio value therein.

In embodiments where a fifth layer is present in the multi-layer coating, the fifth material that forms the fifth layer has a fifth sticking coefficient that enables it to coat vertical or inclined surfaces of the three dimensional feature up to a depth characterized by an aspect ratio (D:W) ranging from about 100:1 to about 300:1, from about 150:1 to about 250:1, or from about 180:1 to about 230:1, or any sub-range of aspect ratios or single aspect ratio value therein.

In embodiments where a sixth layer is present in the multi-layer coating, the sixth material that forms the sixth layer has a sixth sticking coefficient that enables it to coat vertical or inclined surfaces of the three dimensional feature up to a depth characterized by an aspect ratio (D:W) ranging from about 300:1 and greater (e.g., up to about 1000:1), from about 250:1 and greater (e.g., up to about 1000:1), from about 200:1 and greater (e.g., up to about 1000:1), or from about 400:1 and greater (e.g., up to about 1000:1), or any sub-range of aspect ratios or single aspect ratio value therein.

The thickness of the third layer (and any subsequent layers if present, e.g., $4^{th}$ layer through $10^{th}$ layer) may range from any of about 0.5 nm, about 1 nm, about 2 nm, about 3 nm, about 4 nm, about 5 nm, about 6 nm, or about 7 nm to any of about 8 nm, about 9 nm, about 10 nm, about 12 nm, about 15 nm, about 20 nm, about 25 nm, or about 30 nm.

Each of the second through tenth layer, if present, will have an independent corresponding second thickness through tenth thickness. In some embodiments, two or more of the second layer through the tenth layer may have the same thickness. In other embodiments, each layer may have a different thickness. In some embodiments, the thickness of the layers may be uniform throughout said layer. In other embodiments, the thickness of the layers is not uniform throughout said layer such that there will be a greater thickness in one portion of the layer and a smaller thickness in other portions of the layer.

In certain embodiments, the ratio of the first thickness of the base layer (e.g., 155) to each thickness of a subsequent layer, independently (e.g., first thickness to second thickness, first thickness to third thickness, first thickness to fourth thickness, first thickness to fifth thickness, first thickness to sixth thickness, and so on), may range from any of about 200:1, about 180:1, about 160:1, about 140:1, about 120:1, or about 100:1 to any of about 80:1, about 60:1, about 50:1, about 40:1, about 20:1, or about 1:1.

The materials used to form the layers contribute to the sticking coefficient of each layer and its ability to cover horizontal, vertical, and inclined surfaces. Materials that include more fluorine are believed to diffuse better, provide a more conformal coating, and correspond to a smaller sticking coefficient and materials that include less fluorine are believed to diffuse less, provide less conformal coatings, and correspond to a larger sticking coefficient. Hence, each additional layer, having an additional sticking coefficient that is smaller than the sticking coefficient of the preceding layer, is also made of a material that has more fluorine in some embodiments. In this manner, each preceding material that formed a preceding layer may have less fluorine than each additional material that forms an additional layer.

For instance, the third material used to form a third layer 175, if present in the coating, may have a greater amount of fluorine as compared to the amount of fluorine in the second layer 165 or in the base layer 155, but less fluorine as compared to subsequent materials used to form subsequent layers. A non-limiting list of suitable materials that may form the third material of the third layer 175 includes one or more of $CH_3F$, $CH_2F_2$, $C_4F_6$, and $C_4F_8$.

In another example, the fourth material used to form a fourth layer 185, if present in the coating, may have a greater amount of fluorine as compared to the amount of fluorine in the third layer 175, in the second layer 165, or in the base layer 155, but less fluorine as compared to subsequent materials used to form subsequent layers. A non-limiting list of suitable materials that may form the fourth material of the fourth layer 175 includes one or more of $CH_2F_2$, $C_4F_6$, $C_4F_8$, BTBAS-ALD, BDEAS-ALD.

In another example, the fifth material used to form a fifth layer 195, if present in the coating, may have a greater amount of fluorine as compared to the amount of fluorine in the fourth layer 185, in the third layer 175, in the second layer 165, or in the base layer 155, but less fluorine as compared to subsequent materials used to form subsequent layers. A non-limiting list of suitable materials that may form the fourth material of the fourth layer 175 includes one or more of $C_4F_6$, $C_4F_8$, BTBAS-ALD, BDEAS-ALD.

In one embodiment, the base layer has a fluorine concentration ranging from 0% to about 76 atom %, from about 5 atom % to about 65 atom %, from about 10 atom % to about 55 atom %, or any sub-range or single fluorine concentration value therein. In one embodiment, the second layer has a fluorine concentration ranging from 0% to about 76 atom %, from about 15 atom % to about 65 atom %, from about 25 atom % to about 55 atom %, or any sub-range or single fluorine concentration value therein. In one embodiment, the third layer has a fluorine concentration ranging from 50% to about 76 atom %, from about 56 atom % to about 70 atom %, from about 60 atom % to about 65 atom %, or any sub-range or single fluorine concentration value therein. In one embodiment, the fourth layer has a fluorine concentration ranging from 70% to about 76 atom %, from about 71 atom % to about 75 atom %, from about 72 atom % to about 74 atom %, or any sub-range or single fluorine concentration value therein. In one embodiment, the fifth layer has a fluorine concentration ranging from 70% to about 76 atom %, from about 71 atom % to about 75 atom %, from about 72 atom % to about 74 atom %, or any sub-range or single fluorine concentration value therein. In one embodiment, the sixth layer has a fluorine concentration ranging from 0% to about 76 atom %, from about 2 atom % to about 30 atom %, from about 5 atom % to about 10 atom %, or any sub-range or single fluorine concentration value therein.

It may be appreciated that certain materials may be suitable for more than one layer (e.g., $CH_3F$ may be suitable for the base layer, the second layer, and the third layer; $C_4F_6$ may be suitable for the base layer, the second layer, the third layer, the fourth layer, and the fifth layer, and so on). A combination of materials may be utilized for each layer and each material may be present in one or more layer in proportions that would provide for properties (e.g., sticking coefficient, fluorine content, and so on) that are suitable for that particular layer. The materials forming the various layers may also be selected in a manner that should there be cross-contamination among the layers, the properties and deposition characteristics of various layers are not effected or minimally effected.

The layers forming the multi-layer amorphous carbon-containing coatings described herein may be deposited by plasma enhanced chemical vapor deposition as will be described in further detail below with respect to FIG. 4. However, one or more layers may alternatively be formed by other deposition techniques, such as ALD. For example, for additional layers that benefit from increased conformality and/or uniformity, such as, a fourth layer if present, a fifth layer if present, a sixth layer if present, and subsequent layers if present, atomic layer deposition (ALD) technique may be utilized for their deposition.

Various types of ALD processes exist and the specific type may be selected based on several factors such as the surface to be coated, the coating material, chemical interaction between the surface and the coating material, etc. The general principle of an ALD process comprises growing or depositing a thin film layer by repeatedly exposing the surface to be coated to sequential alternating pulses of gaseous chemical precursors that chemically react with the surface one at a time in a self-limiting manner.

ALD deposited layers have a very low porosity of less than 1% in embodiments, less than 0.1% in some embodiments, or approximately 0% in further embodiments. Additionally, ALD deposited layers have a conformal coverage of the underlying surface that is coated with a uniform thickness having a thickness variation of less than about +/−20%, a thickness variation of less than about +/−10%, a thickness variation of less than about +/−5%, or a lower thickness variation between various portions of the covered surface. Hence, layers in the multi-layer coating that are deposited via ALD may exhibit such low porosity, be continuous, conformal and uniform.

FIGS. 2A-2D depict cross-sectional schematic views of an embodiment of a multi-layer amorphous carbon-containing coating deposition and etching sequence. In FIG. 2A, a substrate 200, having a bottom surface 230, and three 3D features in the form of pillars 210, 220, and 225 are shown. Each of the three 3D features, 210, 220, and 225 may be coated with an outside liner and/or with an underlying barrier coating layer 240. The underlying barrier coating layer 240 may be deposited by ALD and may be conformal and with uniform thickness.

Thereafter, plasma enhanced chemical vapor deposition may be used to deposit a base layer 255 onto the top horizontal surfaces 210H, 220H, and 225H of the three dimensional features 210, 220, and 225, respectively, as shown in FIG. 2B. The base layer 255 may have any of the compositions (e.g., type of material and fluorine amount) and/or properties (e.g., sticking coefficient) described above for base layer 155.

While keeping the radio frequency (RF) on and without implementing a RF strike time to stabilize the chamber after deposition of the base layer 255, a second layer 265 is deposited on top of the base layer 255 and over a first portion of a vertical or inclined surface 210V, 220V, 225V, of the three dimensional features 210, 220, and 225, respectively, as shown in FIG. 2C. The second layer 265 may have any of the compositions (e.g., type of material and fluorine amount) and/or properties (e.g., sticking coefficient) described above for second layer 165.

Although not shown in FIGS. 2A-2D, additional layers (e.g., third layer through tenth layer) may be deposited in a similar manner while keeping the RF on and without implementing a RF strike time to stabilize the chamber after deposition of each preceding layer.

Upon completion of the deposition of all layers of the multi-layer coating, the patterned substrate may be subjected to plasma 280, e.g., in a reactive ion etching process, as shown in FIG. 2D.

The layers in the multi-layer coating (e.g., the amorphous carbon therein) will be stripped gradually by plasma (e.g., oxygen plasma). The top carbon layers with high fluorine concentration will be etched firstly, releasing free fluorine, while the base-layer will remain intact to protect the top of the three dimensional feature (e.g., 210H, 220H, and 225H) from attack from the plasma and from attack by the free fluorine that is released. Being that the amount of fluorine is lower in layers that are closer to the surface of the three dimensional feature, the amount of free fluorine that gets released with etching of each underlying layer decreases. Said differently, the free fluorine concentration decreases with less layers remaining. By the time, the plasma (e.g., oxygen plasma) begins stripping the base layer 255 (or 155), which has the smallest fluorine concentration or no fluorine therein, the chamber already has a low concentration of free fluorine. Hence, there is little or no risk that the free fluorine will attack or harm the top horizontal surface of the three dimensional feature (e.g., 210H, 220H, and 225H).

By utilizing the multi-layer amorphous carbon-containing coating described herein, the vulnerable three dimensional feature (and any outside liner deposited thereon such as a thin poly silicone or silicon oxide layer) remains intact (i.e., undamaged) and is protected during processes such as etch and strip processes.

FIG. 3 depicts a flow chart of a method 300 for depositing a multi-layer amorphous carbon-containing coating according to an embodiment. The method includes optionally depositing, via ALD, a conformal coating barrier layer (such as layer 140 in FIG. 1B) directly onto a three dimensional feature (310). The method further includes forming a multi-layer amorphous carbon-containing coating with tunable conformality on a three dimensional feature on a substrate (320), such as the coatings described hereinabove with respect to FIGS. 1A-1B and 2A-2D.

Forming a multi-layer amorphous carbon-containing coating with tunable conformality on a three dimensional feature on a substrate may be accomplished by depositing a base layer (such as layers 155 and 255 in FIGS. 1B and 2B, respectively) onto a horizontal surface of the three dimensional feature (330). The base layer may have any of the compositions (e.g., type of material and fluorine amount) and/or properties (e.g., sticking coefficient, thickness, etc.)

described above for base layer 155. In one embodiment, the base layer is deposited using plasma enhanced chemical vapor deposition (PECVD).

Forming a multi-layer amorphous carbon-containing coating with tunable conformality on a three dimensional feature on a substrate may further be accomplished by depositing a second layer (such as layers 165 and 265 in FIGS. 1B and 2C, recpectively) over the base layer and onto a first portion of a vertical or inclined surface of the three dimensional feature (340). The second layer may have any of the compositions (e.g., type of material and fluorine amount) and/or properties (e.g., sticking coefficient, thickness, coating ability suitable for a certain aspect ratio, etc.) described above for second layer 165. In one embodiment, the second layer is deposited using plasma enhanced chemical vapor deposition (PECVD). In one embodiment, the second layer is deposited using atomic layer deposition (ALD).

In certain embodiments, forming a multi-layer amorphous carbon-containing coating with tunable conformality on a three dimensional feature on a substrate may further be accomplished by optionally depositing a third layer (such as layer 175 in FIG. 1B) over the second layer and onto a second portion of the vertical or inclined surface of the three dimensional feature, the second portion reaching deeper along the vertical or inclined surface of the three dimensional feature than the first portion (350). The third layer may have any of the compositions (e.g., type of material and fluorine amount) and/or properties (e.g., sticking coefficient, thickness, coating ability suitable for a certain aspect ratio, etc.) described above for third layer 175. In one embodiment, the third layer is deposited using plasma enhanced chemical vapor deposition (PECVD). In one embodiment, the third layer is deposited using atomic layer deposition (ALD).

In certain embodiments, forming a multi-layer amorphous carbon-containing coating with tunable conformality on a three dimensional feature on a substrate may further be accomplished by optionally repeating deposition of at least one additional layer (such as a fourth layer 185, a fifth layer 195, a sixth layer and so on up to a tenth layer) over a preceding layer and onto an additional portion of the vertical or inclined surface of the three dimensional feature, the additional portion reaching deeper along the vertical or inclined surface of the three dimensional feature than the preceding portion covered by the preceding layer (360). Any additional layer may have any of the compositions (e.g., type of material and fluorine amount) and/or properties (e.g., sticking coefficient, thickness, coating ability suitable for a certain aspect ratio, etc.) described above with respect to FIG. 1B. In one embodiment, the additional layer is deposited using plasma enhanced chemical vapor deposition (PECVD). In one embodiment, the additional layer is deposited using atomic layer deposition (ALD).

Method 300 may be performed in an etch chamber, such as chamber 600 depicted in FIG. 6, with enabled RF back-to-back plasma enhanced chemical vapor deposition technique for high throughput. The RF back-to-back enables continuous deposition of a plurality of layers that form the multi-layer coating. In the RF back-to-back technique, the plasma is not turned off and the chamber is not stabilized after deposition of each layer. This reduces the plasma strike time and provides for a device manufacturing process that is more efficient than existing processes.

For instance, the duration for depositing each layer in the multi-layer coating may range from about 4 to about 5 seconds. Stabilization time of the etch chamber for the RF to stabilize may take at least about 3 seconds or more. In certain instances, the stabilization time may be as long as the layer deposition duration or even longer. By depositing the multi-layer coating with the RF back-to-back technique and cutting the stabilization time, the coating and/or device manufacturing time may be significantly reduced and the yield of three dimensional devices may be significantly enhanced.

Figures 4, 5:
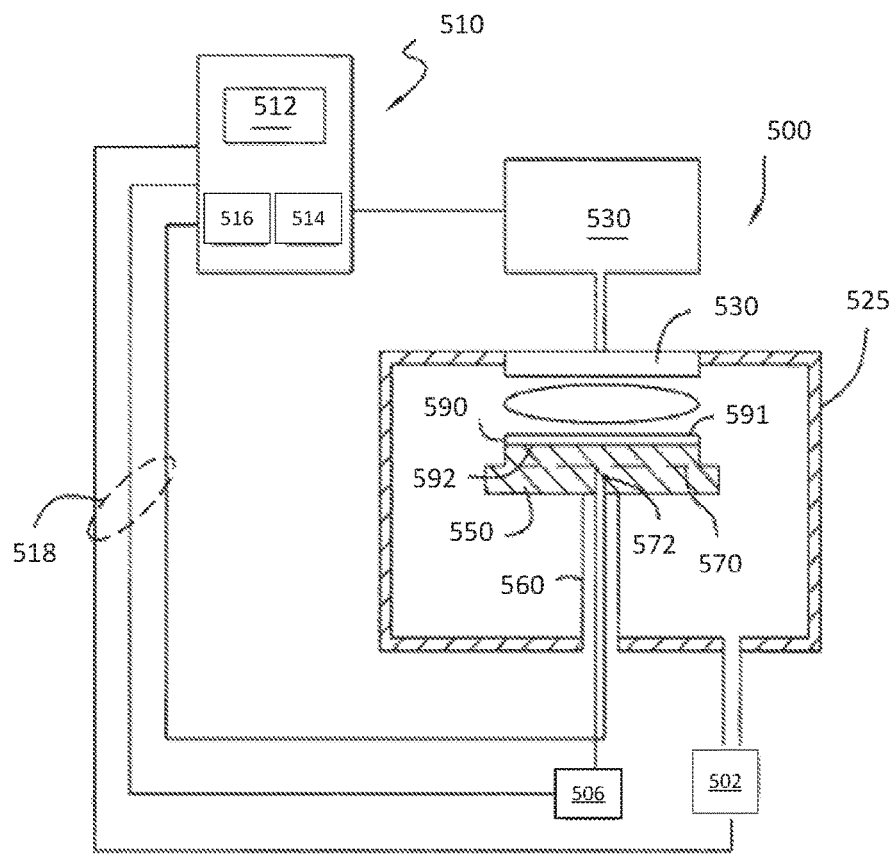
FIG. 4 depicts a flow chart of a method for manufacturing a three dimensional device according to an embodiment.
FIG. 5 illustrates an apparatus that may be utilized for manufacturing a three dimensional device according to an embodiment.

FIG. 4 depicts a flow chart of a method 400 for manufacturing a three dimensional device according to an embodiment. The method includes forming a multi-layer amorphous carbon-containing coating with tunable conformality on the three dimensional feature (410). Forming the multi-layer coating may be performed as explained hereinabove with respect to FIG. 3.

The method for manufacturing the three dimensional device further includes etching the bottom surface of the substrate (e.g., 130 and 230 in FIGS. 1A-1B and 2A-2D) and the multi-layer amorphous carbon-containing coating without etching the underlying one or more three dimensional features on the substrate (420).

In certain embodiments, the manufacturing process may continue by looping back to forming a multi-layer amorphous carbon-containing coating with tunable conformality on the three dimensional feature, as per block 410, followed by etching the bottom surface of the substrate (e.g., 130 and 230 in FIGS. 1A-1B and 2A-2D) and the multi-layer amorphous carbon-containing coating without etching the underlying one or more three dimensional features on the substrate, as per block 420.

Oxygen plasma may be used to remove residual carbon from the chamber so that there is no left over carbon in the chamber in the event that the manufacturing process is a multi-loop process, being that residual carbon in subsequent rounds of the multi-layer coating deposition could modify the shape of the coating. Oxygen plasma may be used during deposition of one or more of the layers of the multi-layer coating, after depositing the multi-layer coating and prior to etching, or after etching. In one embodiment, oxygen plasma is used during deposition of one or more layers of the multi-layer coating. In one embodiment, oxygen plasma is used prior to etching but after having deposited the multi-layer coating. In one embodiment, oxygen plasma is used after etching the substrate.

During processing, free fluorine is released from top layers (that are rich in fluorine) in the multi-layer coating. Oxygen plasma is used to flush the free fluorine out of the chamber to minimize the attack of the fluorine on the three dimensional feature. Some free fluorine may still attack (e.g., etch) the three dimensional structure prior to being flushed out. However, underlying layers of the multi-layer coating protect the three dimensional feature from such free fluorine attack. With time, the free fluorine concentration in the chamber will decrease since inner layers of the multi-layer coating have a lower fluorine concentration therein. Furthermore, the amount of free fluorine released from these inner layers will be sufficiently low as to not pose a significant risk to the underlying structure of the three dimensional feature.

The deposition of the multi-layer coating (whether by plasma enhanced chemical vapor deposition or atomic layer deposition) and the etching of the substrate occurs in the same chamber.

FIG. 5 illustrates an apparatus that may be utilized for manufacturing a three dimensional device according to an embodiment. The apparatus 500 may be used to deposit one or more layers of the multi-layer protective coating described herein on a substrate comprising high aspect ratio features using plasma enhanced chemical vapor deposition (PECVD), atomic layer deposition (ALD), and the like. Apparatus 500 includes a process chamber 525, a gas panel 530, a control unit 510, and other hardware components such as power supplies and vacuum pumps.

The process chamber 525 generally comprises a support pedestal 550, which is used to support a substrate 590. This pedestal 550 moves in a vertical direction inside the chamber 525 using a displacement mechanism (not shown). Depending on the process, the substrate 590 can be heated to a set temperature prior to processing. The substrate support pedestal 550 is heated by an embedded heater element 570. For example, the pedestal 550 may be resistively heated by applying an electric current from an AC supply 506 to the heater element 570. The substrate 590 is, in turn, heated by the pedestal 550. A temperature sensor 572, such as a thermocouple, is also embedded in the substrate support pedestal 550 to monitor the temperature of the pedestal 550. The measured temperature is used in a feedback loop to control the power supply 506 for the heating element 570. The substrate temperature can be maintained or controlled at a temperature which is selected for the particular process application. The pedestal 550 is optionally heated using a plasma or by radiant heat.

A vacuum pump 502 is used to evacuate the process chamber 525 and to maintain the proper gas flows and pressure inside the chamber 525. A showerhead 520, through which process gases (such as hydrocarbons, fluorinated hydrocarbons, ALD precursors and reactants, and the like) are introduced into the chamber 525, is located above the substrate support pedestal 550. The showerhead 520 is connected to a gas panel 530, which controls and supplies various gases used in different steps of the process sequence.

The gas panel 530 may also be used to control and supply various vaporized liquid precursors. While not shown, liquid precursors from a liquid precursor supply may be vaporized, for example, by a liquid injection vaporizer, and delivered to the process chamber in the presence of a carrier gas. The carrier gas is typically an inert gas, such as nitrogen, or a noble gas, such as argon or helium. Alternatively, the liquid precursor may be vaporized from an ampoule by a thermal and/or vacuum enhanced vaporization process.

The showerhead 520 and substrate support pedestal 550 may also form a pair of spaced apart electrodes. When an electric field is generated between these electrodes, the process gases introduced into the chamber 525 are ignited into a plasma. Typically, the electric field is generated by connecting the substrate support pedestal 550 to a source of single-frequency or dual-frequency radio frequency (RF) power (not shown) through a matching network (not shown). Alternatively, the RF power source and matching network may be coupled to the showerhead 520, or coupled to both the showerhead 520 and the substrate support pedestal 550.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

In the present embodiment, amorphous carbon layer deposition is accomplished by plasma enhanced thermal decomposition of a hydrocarbon compound or a fluorine doped hydrocarbon compound. The hydrocarbon compound or fluorine doped hydrocarbon compound is introduced into the process chamber 525 under the control of gas panel 530. The hydrocarbon compound or fluorine doped hydrocarbon is introduced into the process chamber as a gas with a regulated flow.

Proper control and regulation of the gas and liquid flows through the gas panel 530 is performed by mass flow controllers (not shown) and a controller unit 510 such as a computer. The showerhead 520 allows process gases from the gas panel 530 to be uniformly distributed and introduced into the process chamber 525. Illustratively, the control unit 510 comprises a central processing unit (CPU) 512, support circuitry 514, and memories containing associated control software 516. This control unit 510 is responsible for automated control of the numerous steps required for substrate processing—such as substrate transport, gas flow control, liquid flow control, temperature control, chamber evacuation, and so on. Bi-directional communications between the control unit 510 and the various components of the apparatus are handled through numerous signal cables collectively referred to as signal buses 518, some of which are illustrated in FIG. 5.

By properly adjusting the current supplied to the heating element 570, the substrate 590 and the pedestal 550 can be maintained at a relatively constant temperature during the coating deposition. This is accomplished by a feedback control loop, in which the temperature of the pedestal 550 is continuously monitored by a thermocouple 572 embedded in the pedestal 550. This information is transmitted to the control unit 510 via a signal bus 518, which responds by sending the necessary signals to the heater power supply. Adjustment is subsequently made in the current supply 506 so as to maintain and control the pedestal 550 at a desirable temperature, for example, a temperature that is appropriate for the specific process application. The PECVD and the ALD processes may be performed in the same chamber. For instance, the temperature that may be used for atomic layer deposition ranges from any of about 5° C., about 15° C., about 30° C., about 50° C., or about 75° C. to any of about 100° C., about 125° C., about 150° C., about 175° C., about 200° C., or about 250° C. In another examples, the temperature that may be used for depositing the hydrocarbon or fluorinated hydrocarbon layers may range from any of about 5° C., about 10° C., about 15° C., about 20° C., or about 25° C. to any of about 30° C., about 35° C., about 40° C., about 45° C., or about 50° C.

When the process gas mixture exits the showerhead 520, plasma enhanced thermal decomposition of the hydrocarbon compound to ions and radicals ion occurs at the surface 591 of the heated substrate 590, resulting in a the radicals leading to the deposition of an amorphous carbon layer on the substrate 590. The parameters that affect the thickness, density, and roughness of the coating 591 include type of gas (e.g., composition), gas flow rate, biasing power and plasma source power (energy input), pressure, temperature, and so on. For instance, with higher temperature, certain gases can coat deeper portions of the vertical or inclined surfaces of the three dimensional features. In another example, the pressure may be controlled to control the shape of the layers in the multi-layer coating.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method for providing directional protection to a three dimensional feature on a substrate, the method comprising:
    forming a multi-layer amorphous carbon-containing coating with tunable conformality on the three dimensional feature by:
        depositing a base layer onto a horizontal surface of the three dimensional feature, the base layer comprising a first material having a first sticking coefficient; and
        depositing a second layer over the base layer and onto a first portion of a vertical or inclined surface of the three dimensional feature, the second layer comprising a second material having a second sticking coefficient that is smaller than the first sticking coefficient,
    wherein the first material comprises no fluorine or less fluorine than the second material.

2. The method of claim 1, wherein the first material that forms the base layer comprises one or more of $SiCl_4$, $CH_4$, $CH_3F$, $CH_2F_2$, $C_4F_6$, $C_4F_8$.

3. The method of claim 1, wherein the second material that forms the second layer comprises one or more of $CH_4$, $CH_3F$, $CH_2F_2$, $C_4F_6$, $C_4F_8$, and wherein the first portion of the vertical or inclined surface of the three dimensional feature correlates to an aspect ratio of up to 10:1.

4. The method of claim 1, wherein the three dimensional feature has an aspect ratio ranging from about 10:1 to about 500:1
    wherein the multi-layer amorphous carbon-containing coating comprises from 2 to 10 layers,
    wherein the base layer has a first thickness,
    wherein each second layer to tenth layer, if present, independently have a corresponding second thickness to tenth thickness, and
    wherein a ratio of the first thickness to each of the corresponding second thickness to tenth thickness independently ranges from about 200:1 to about 1:1.

5. The method of claim 1, wherein forming the multi-layer amorphous carbon-containing coating further comprises depositing a third layer over the second layer and onto a second portion of the vertical or inclined surface of the three dimensional feature, the second portion reaching deeper along the vertical or inclined surface of the three dimensional feature than the first portion, wherein the third layer comprises a third material having a third sticking coefficient that is smaller than the second sticking coefficient, and wherein the second material having the second sticking coefficient comprise less fluorine than the third material having the third sticking coefficient.

6. The method of claim 5, wherein the third material that forms the third layer comprises one or more of $CH_3F$, $CH_2F_2$, $C_4F_6$, $C_4F_8$, and wherein the second portion of the vertical or inclined surface of the three dimensional feature correlates to an aspect ratio of about 10:1 to about 50:1.

7. The method of claim 5, wherein forming the multi-layer amorphous carbon-containing coating further comprises repeating deposition of at least one additional layer, wherein each additional layer is deposited over a preceding layer and onto a portion of the vertical or inclined surface of the three dimensional feature that reaches deeper along the vertical surface of the three dimensional feature than a preceding portion covered by the preceding layer, wherein each additional layer is formed of an additional material having an additional sticking coefficient that is smaller than a sticking coefficient of the preceding layer, and wherein each preceding material comprises less fluorine than the additional material.

8. The method of claim 7,
    wherein a fourth material that forms a fourth layer comprises one or more of $CH_2F_2$, $C_4F_6$, $C_4F_8$, BTBAS-ALD, BDEAS-ALD, and wherein a third portion of the vertical or inclined surface of the three dimensional feature that would be coated with the fourth layer correlates to an aspect ratio of about 50:1 to about 100:1,
    wherein a fifth material that forms a fifth layer, if present, comprises one or more of $C_4F_6$, $C_4F_8$, BTBAS-ALD, BDEAS-ALD, and wherein a fourth portion of the vertical or inclined surface of the three dimensional feature that would be coated with the fifth layer correlates to an aspect ratio of about 100:1 to about 300:1, and
    wherein a sixth material that forms a sixth layer, if present, comprises one or more of BTBAS-ALD, BDEAS-ALD, and wherein a fifth portion of the vertical surface of the three dimensional feature that would be coated with the sixth layer correlates to an aspect ratio of about 300:1 or greater.

9. The method of claim 1, further comprising depositing, via atomic layer deposition, a conformal barrier coating layer directly onto the three dimensional feature, prior to forming the multi-layer amorphous carbon-containing coating.

10. The method of claim 1, wherein the base layer and the second layer are deposited via plasma-enhanced chemical vapor deposition.

11. The method of claim 1, wherein the multi-layer amorphous carbon-containing coating is deposited with RF back-to-back technique.

12. A three dimensional device comprising:
a substrate having a three dimensional feature thereon, the three dimensional feature having a horizontal surface and a vertical or inclined surface; and
a multi-layer amorphous carbon-containing coating with tunable conformality coated over the three dimensional feature, the multi-layer amorphous carbon-containing coating comprising:
   a base layer coated onto the horizontal surface of the three dimensional feature, the base layer comprising a first material having a first sticking coefficient; and
   a second layer coated over the base layer and over a first portion of the vertical or inclined surface of the three dimensional feature, the second layer comprising a second material having a second sticking coefficient that is smaller than the first sticking coefficient,
   wherein the first material comprises no fluorine or less fluorine than the second material.

13. The three dimensional device of claim 12, wherein the first material that forms the base layer comprises one or more of $SiCl_4$, $CH_4$, $CH_3F$, $CH_2F_2$, $C_4F_6$, $C_4F_8$.

14. The three dimensional device of claim 12, wherein the second material that forms the second layer comprises one or more of $CH_4$, $CH_3F$, $CH_2F_2$, $C_4F_6$, $C_4F_8$, and wherein the first portion of the vertical or inclined surface of the three dimensional feature correlates to an aspect ratio of up to 10:1.

15. The three dimensional device of claim 12, wherein the three dimensional feature has an aspect ratio ranging from about 10:1 to about 500:1,
   wherein the multi-layer amorphous carbon-containing coating comprises from 2 to 10 layers,
   wherein the base layer has a first thickness,
   wherein each second layer to tenth layer, if present, independently have a corresponding second thickness to tenth thickness, and
   wherein a ratio of the first thickness to each of the corresponding second thickness to tenth thickness independently ranges from about 200:1 to about 1:1.

16. The three dimensional device of claim 12,
   wherein the multi-layer amorphous carbon-containing coating further comprises a third layer coated over the second layer and over a second portion of the vertical or inclined surface of the three dimensional feature, the second portion reaching deeper along the vertical or inclined surface of the three dimensional feature than the first portion,
   wherein the third layer comprises a third material having a third sticking coefficient that is smaller than the second sticking coefficient,
   wherein the second material comprises less fluorine than the third material,
   wherein the third material that forms the third layer comprises one or more of $CH_3F$, $CH_2F_2$, $C_4F_6$, $C_4F_8$, and
   wherein the second portion of the vertical or inclined surface of the three dimensional feature correlates to an aspect ratio of about 10:1 to about 50:1.

17. The three dimensional device of claim 12,
   wherein the multi-layer amorphous carbon-containing coating further comprises at least one additional layer, wherein each additional layer is coated over a preceding layer and onto a portion of the vertical or inclined surface of the three dimensional feature that reaches deeper along the vertical or inclined surface of the three dimensional feature than a preceding portion covered by the preceding layer,
   wherein each additional layer comprises an additional material having an additional sticking coefficient that is smaller than a sticking coefficient of the preceding layer, and
   wherein each preceding material of each preceding layer comprises less fluorine than each additional material of each additional layer.

18. The three dimensional device of claim 17,
   wherein a fourth material that forms a fourth layer comprises one or more of $CH_2F_2$, $C_4F_6$, $C_4F_8$, BTBAS-ALD, BDEAS-ALD, and wherein a third portion of the vertical or inclined surface of the three dimensional feature that would be coated with the fourth layer correlates to an aspect ratio of about 50:1 to about 100:1,
   wherein a fifth material that forms a fifth layer, if present, comprises one or more of $C_4F_6$, $C_4F_8$, BTBAS-ALD, BDEAS-ALD, and wherein a fourth portion of the vertical or inclined surface of the three dimensional feature that would be coated with the fifth layer correlates to an aspect ratio of about 100:1 to about 300:1, and
   wherein a sixth material that forms a sixth layer, if present, comprises one or more of BTBAS-ALD, BDEAS-ALD, or a mixture thereof, and wherein a fifth portion of the vertical or inclined surface of the three dimensional feature that would be coated with the sixth layer correlates to an aspect ratio of about 300:1 or greater.

19. The three dimensional device of claim 12, further comprising an atomic layer deposition (ALD) deposited conformal barrier coating layer underneath the multi-layer amorphous carbon-containing coating.

20. A method for manufacturing a three dimensional device, the method comprising:
   forming a multi-layer amorphous carbon-containing coating with tunable conformality on one or more three dimensional features on a substrate by:
   depositing a base layer onto a horizontal surface of the three dimensional feature, the base layer comprising a first material having a first sticking coefficient; and
   depositing a second layer over the base layer and onto a first portion of a vertical or inclined surface of the three dimensional feature, the second layer comprising a second material having a second sticking coefficient that is smaller than the first sticking coefficient, wherein the first material comprises no fluorine or less fluorine than the second material; and etching the substrate and the multi-layer amorphous carbon-containing coating without etching the underlying one or more three dimensional features on the substrate.

* * * * *